(12) United States Patent
Kim

(10) Patent No.: US 7,268,041 B2
(45) Date of Patent: Sep. 11, 2007

(54) METHOD OF FORMING SOURCE CONTACT OF FLASH MEMORY DEVICE

(75) Inventor: Tae Kyung Kim, Icheon-si (KR)

(73) Assignee: Hynix Semiconductor Inc., Icheon-shi (KR)

( * ) Notice: Subject to any disclaimer, the term of this patent is extended or adjusted under 35 U.S.C. 154(b) by 235 days.

(21) Appl. No.: 11/138,694

(22) Filed: May 27, 2005

(65) Prior Publication Data

US 2006/0110874 A1    May 25, 2006

(30) Foreign Application Priority Data

Oct. 25, 2004  (KR) .................... 10-2004-0085428

(51) Int. Cl.
    *H01L 21/336* (2006.01)
(52) U.S. Cl. ............. 438/266; 257/E21.69; 257/21.691
(58) Field of Classification Search ................ 438/266; 257/E21.69, E21.691
    See application file for complete search history.

(56) References Cited

U.S. PATENT DOCUMENTS

| 6,133,096 A | 10/2000 | Su et al. ................ 438/264 |
| 6,146,742 A * | 11/2000 | Hsieh et al. ............. 428/209 |
| 6,551,928 B2 * | 4/2003 | Wu ............................ 438/683 |
| 6,605,530 B2 * | 8/2003 | Nakamura et al. ......... 438/627 |
| 2002/0014205 A1 * | 2/2002 | Shin et al. ................ 118/715 |
| 2002/0115256 A1 * | 8/2002 | Lee et al. .................. 438/262 |
| 2002/0141242 A1 * | 10/2002 | Noguchi et al. ....... 365/185.22 |

* cited by examiner

*Primary Examiner*—Trung Dang
(74) *Attorney, Agent, or Firm*—Mayer, Brown, Rowe and Maw LLP

(57) ABSTRACT

The present invention relates to a method of forming a source contact of a flash memory device. According to the present invention, the method includes the steps of forming a first interlayer insulating film on a semiconductor substrate in which first junction regions and second junction regions both of which are formed in a cell transistor of a cell region, a gate electrode patter for SSL of the cell region, a gate electrode pattern for DSL of the cell region, and a gate electrode pattern for peripheral circuits of a peripheral region, patterning the first interlayer insulating film to form a source contact hole through which the first and second junction regions are exposed on one sides of the gate electrode pattern of SSL, forming a film having a tungsten silicide film on the entire surface in which the source contact hole is formed, and performing a polishing process until the first interlayer insulating film is exposed to bury only the source contact hole with the film having the tungsten silicide film, thereby forming a source contact.

14 Claims, 3 Drawing Sheets

METHOD OF FORMING SOURCE CONTACT OF FLASH MEMORY DEVICE

BACKGROUND

1. Field of the Invention

The present invention relates to a method of manufacturing a semiconductor device, and more specifically, to a method of forming a source contact of a flash memory device.

2. Discussion of Related Art

Generally, in manufacturing a semiconductor device, a polysilicon film or a tungsten film is used to form a source contact of a flash memory device.

If the polysilicon film is used in the source contact, burial characteristics are good. If a thermal treatment process is used, however, there are problems in that a process time lengthens, and a metal line and contact resistance become high.

Meanwhile, if the tungsten film is used in the source contact, the metal line and contact resistance are better than those when the polysilicon film is used. However, the tungsten film is easily oxidized at a temperature of about 400° C., a silicide film is formed at a temperature of about 600° C., and adhesive force is poor in an oxide film or a nitride film. This requires a deposition process of a junction layer to be added.

In the case where a titanium film is used as the junction layer, there is a problem in that a process of forming metallic anti-diffusion films has to be added in order to prevent a combination of the titanium film having high reactivity with a reaction gas of tungsten.

SUMMARY OF THE INVENTION

Accordingly, the present invention has been made in view of the above problems, and it is an object of the present invention to provide a method of forming a source contact of a flash memory device, wherein metal line and contact resistance characteristics are good, and device characteristics can also be prevented from lowering while a subsequent thermal treatment process is performed.

To achieve the above object, according to an aspect of the present invention, there is provided a method of forming a source contact of a flash memory device, including the steps of forming a first interlayer insulating film on a semiconductor substrate in which first junction regions having a gate electrode pattern for SSL of a cell region are formed, patterning the first interlayer insulating film to form a source contact hole through which the first junction regions are exposed on one sides of the gate electrode pattern for SSL, forming a film having a tungsten silicide film on the entire surface including the source contact hole, and performing a polishing process until the first interlayer insulating film is exposed to bury only the source contact hole with the film having the tungsten silicide film, thereby forming a source contact.

Preferably, the film having the tungsten silicide film can be one of a tungsten silicide film, a tungsten silicide film/polysilicon film, a polysilicon film/tungsten silicide film, and a dual film of a tungsten silicide film. The tungsten silicide film can be preferably formed CVD mode using a MS ($SiH_4$) or DSC ($SiH_2Cl_2$)-based $WSi_x$ film at a temperature of about 330 to 450° C. or 550 to 600° C. and pressure of about 0.4 to 3 Torr.

The method can further include the steps of forming a second interlayer insulating film on the entire surface including the source contact, patterning the second interlayer insulating film to expose the first junction regions formed in a gate electrode pattern for peripheral circuits of a peripheral region, performing an ion implant process on the entire surface in which the first junction regions formed in the gate electrode pattern for the peripheral circuits of the peripheral region are exposed, and performing a thermal treatment process to form second junction regions in the first junction regions.

The thermal treatment process can be preferably formed at a temperature of about 850 to 1000° C. for about 20 to 40 minutes, or at a temperature of about 900 to 1000° C. for about 10 to 20 seconds.

DETAILED DESCRIPTION OF PREFERRED EMBODIMENTS

Figure 1:
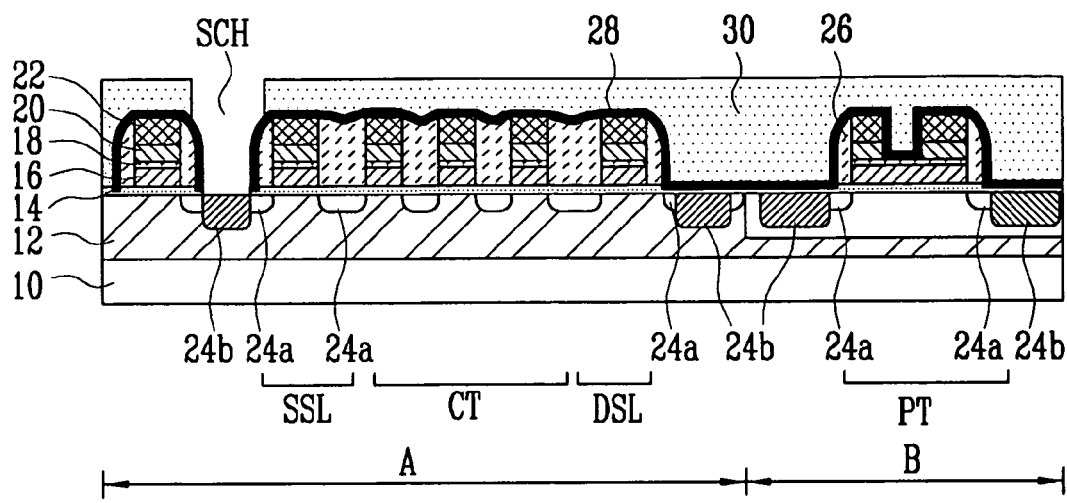
FIGS. 1 to 6 are cross-sectional views for explaining a method of forming a source contact of a flash memory device according to the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

FIGS. 1 to 6 are cross-sectional views for explaining a method of forming a source contact of a flash memory device according to the present invention.

Referring to FIG. 1, an insulating film 14 for tunnel oxide film, a first polysilicon film 16 for floating gate electrode, an ONO film 18, a second polysilicon film 20 for control gate electrode, and a tungsten silicide film 22 are sequentially formed on a semiconductor substrate 10 in which a cell region A and a peripheral region B are defined.

A photoresist pattern (not shown) for gate electrode is formed on the tungsten suicide film 22. The tungsten silicide film 22, the second polysilicon film 20 for control gate electrode, the ONO film 18, the first polysilicon film 16 for floating gate electrode, and the insulating film 14 for tunnel oxide film using the photoresist pattern as an etch mask are etched to form a gate electrode pattern.

The gate electrode pattern has a cell transistors CT, a gate electrode pattern SSL for SSL, and a gate electrode pattern DSL for DSL formed in the cell region A, and a gate electrode pattern PT for peripheral circuits formed in the peripheral region B.

An ion implant process is performed on the entire surface including the gate electrode patterns, thus forming first junction regions 24a.

After a nitride film is formed on the entire surface in which the gate electrode patterns are formed, an etch-back process is performed on the nitride film to form spacers 26 on both sidewalls of the gate electrode pattern PT for peripheral circuits, on one sidewall of the gate electrode pattern DSL for drain select line DSL, and on one sidewall of the gate electrode pattern SSL for source select line SSL. Furthermore, the nitride film is buried between the cell transistor and the cell transistor, one sidewall of the gate electrode pattern DSL for DSL and the cell transistor, and one sidewall of the gate electrode pattern SSL for SSL and the cell transistor, thereby providing insulation among them.

An ion implant process is then performed on the entire surface including the spacers 26 to form second junction regions 24b.

Thereafter, the gate electrode pattern PT for peripheral circuits to form a photoresist pattern (not shown) for forming a butting contact hole. An etch process using the photoresist pattern as an etch mask is performed form the butting contact hole through an ONO film is exposed. An ashing process for stripping the photoresist pattern (not shown) is then performed.

An oxidization process is performed on the entire surface in which the butting contact hole is formed in the gate electrode pattern for peripheral circuits to form a buffer oxide film (not shown). A nitride film 28 for SAC is then formed on the buffer oxide film (not shown).

A first interlayer insulating film 30 such as a HDP oxide film is then formed on the entire surface in which the formed buffer oxide film (not shown) and the nitride film 28 for SAC are formed. After forming a photoresist pattern (not shown) on the HDP oxide film 30 so that a source contact of a trench type is defined, an etch process using the photoresist pattern as an etch mask is performed to form a source contact hole SCH of a trench type through which the second junction regions 24b are exposed. An ashing process for removing the photoresist pattern (not shown) is then performed.

Figure 2:
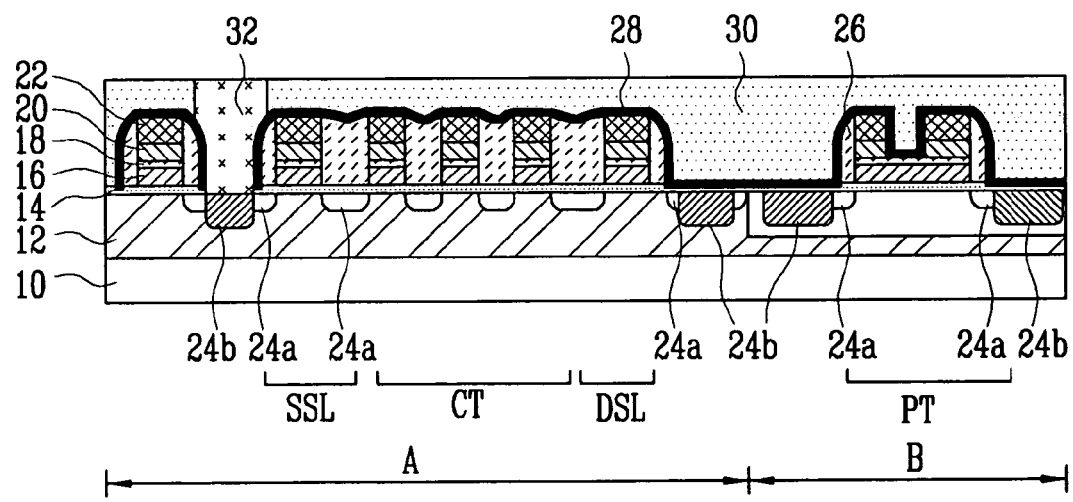

Referring to FIG. 2, a film including the tungsten silicide film is formed on the entire surface in which the source contact hole SCH is formed. A polishing process such as CMP process is then performed until the first interlayer insulating film 30 is exposed, thus forming a source contact 32.

A film including a tungsten silicide film is used in the source contact. This may include any one of a tungsten silicide film, a tungsten silicide film/polysilicon film, a polysilicon film/tungsten silicide film, and a dual film of a tungsten silicide film.

The tungsten silicide film can be formed in CVD mode having good layer covering, and can be formed using a MS ($SiH_4$) or DSC ($SiH_2Cl_2$)-based $WSi_x$ film at a temperature of about 330 to 450° C. or 550 to 600° C. and pressure of about 0.4 to 3 Torr.

The source contact 32 formed using the tungsten silicide film can reduce line and contact resistance compared to the source contact formed using an existing polysilicon film. In this case, the tungsten silicide film can be deposited even without using a glue layer or anti-diffusion films, and can also be in ohmic contact with a silicon semiconductor substrate even without a thermal treatment process.

Figure 3:
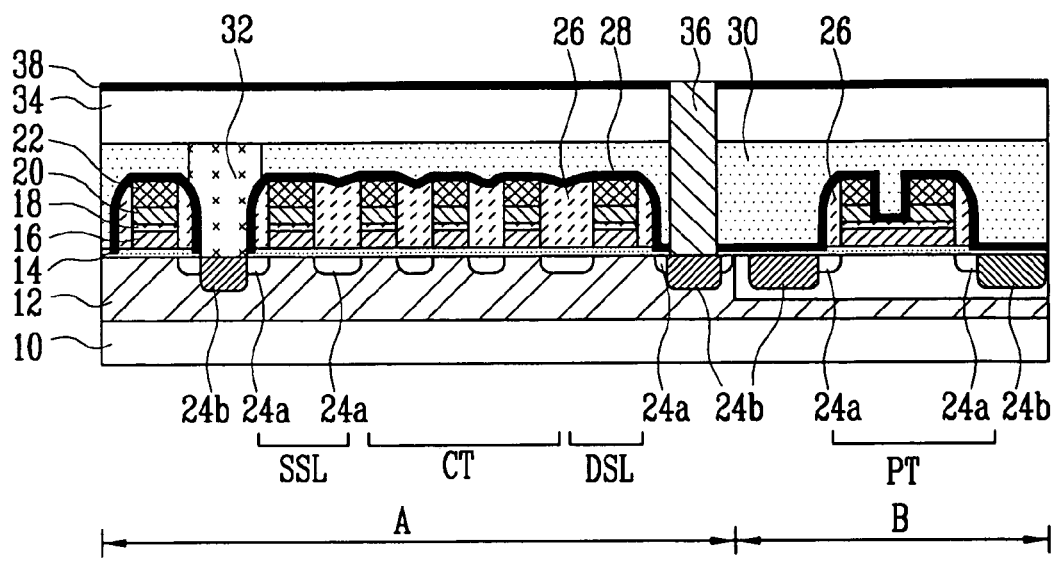

Referring to FIG. 3, a second interlayer insulating film 34 and an etch-stop film 38 are sequentially formed on the entire surface including the source contact 32. After a photoresist pattern (not shown) is formed on the etch-stop film 38 to define a drain contact of a trench type, an etch process using the photoresist pattern as an etch mask is performed to form a drain contact hole (not shown) of a trench type through which the second junction regions 24b are exposed. An ashing process for stripping the photoresist pattern (not shown) is then performed. A metal material is formed on the entire surface including the drain contact hole, and a polishing process such as CMP process is then performed until the etch-stop film 38 is exposed, thereby forming a drain contact 36.

Figure 4:
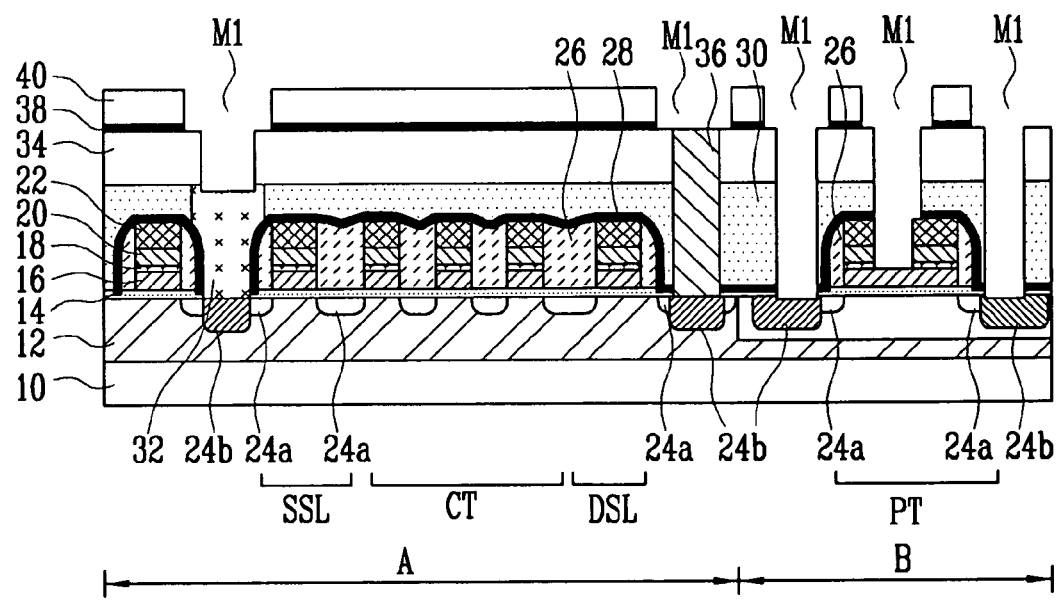

Referring to FIG. 4, a third interlayer insulating film 40 is formed on the entire surface including the drain contact 36. A photoresist pattern (not shown) through which the drain contact 36 of the cell region A, the source contact 32, the second junction regions 24b of the peripheral region B and the butting contact hole are exposed is formed on the third interlayer insulating film 40. An etch process using the photoresist pattern as an etch mask is then performed to form first via holes M1. An ashing process for stripping the photoresist pattern (not shown) is performed.

Figure 5:
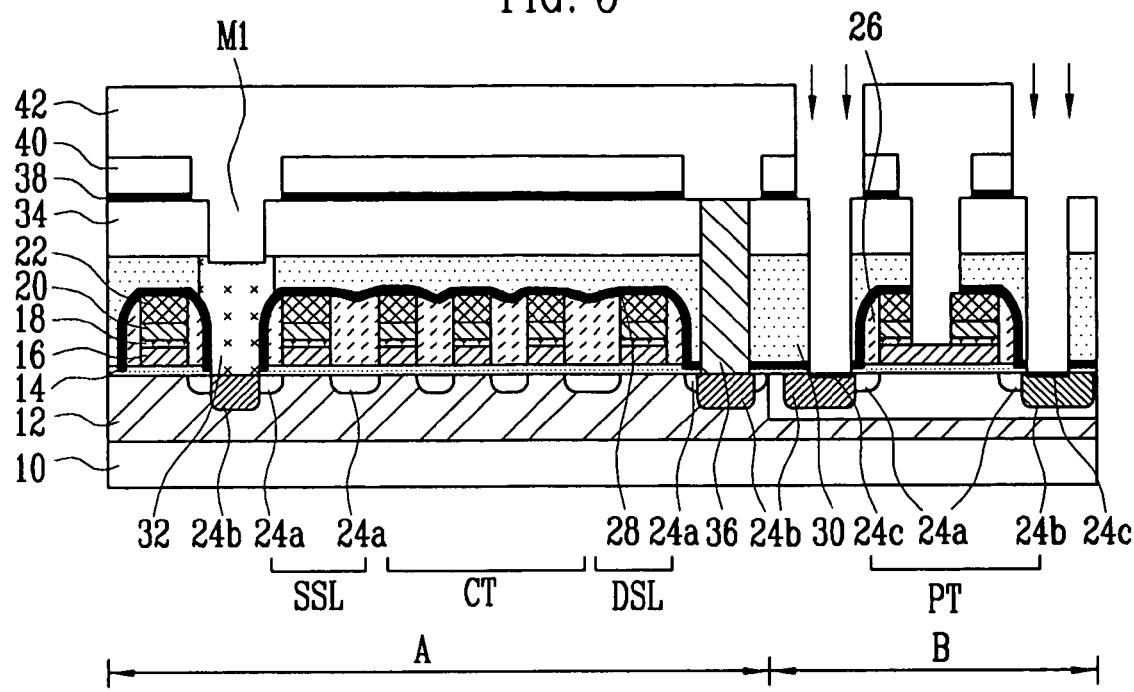

Referring to FIG. 5, a photoresist pattern 42 through which only the second junction regions 24b are exposed is formed on the entire surface including the first via holes M1. An ion implant process using the photoresist pattern 42 as an ion implant mask is then performed to form third junction regions 24c in the second junction regions 24b of the peripheral region B. A thermal treatment process is then performed on the entire surface including the third junction regions 24c.

In this case, the thermal treatment process can be performed at a temperature of about 850 to 1000° C. for about 20 to 40 minutes, or at a temperature of about 900 to 1000° C. for about 10 to 20 seconds.

If an annealing process is performed after the source contact of the tungsten silicide is formed, contact resistance of silicon with the semiconductor substrate is reduced. Specific resistance is also reduced while silicon is recrystallized into a stable phase.

Figure 6:
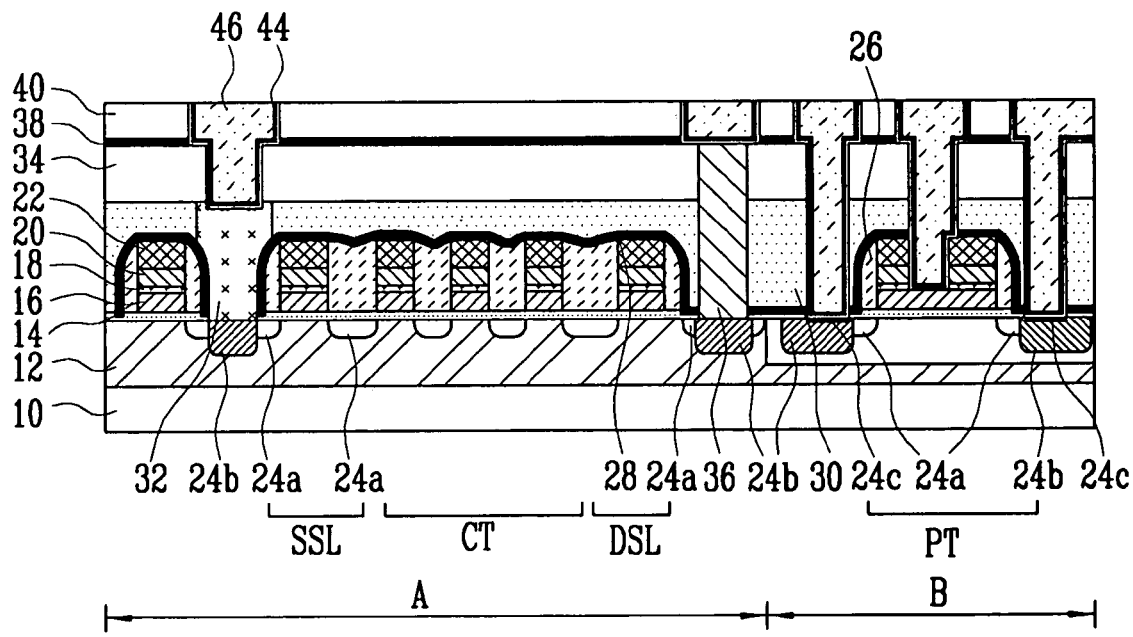

Referring to FIG. 6, anti-diffusion films 44 are formed along the sidewalls of the entire surface including the third junction regions 24c. After a metal material is formed on the entire surface, a polishing process such as CMP process is performed until the anti-diffusion films 44 are exposed, thereby completing formation of the second metal line 46.

As described above, according to the present invention, a source contact is formed using a tungsten silicide film, and thus has better line and contact resistance characteristics than those of a source contact formed of an existing polysilicon film. It also has better adhesive force in an oxide film or nitride film, which makes a junction layer unnecessary.

Furthermore, as the source contact is formed of the tungsten silicide film, ohmic contact is possible even without a junction layer and a metal anti-diffusion film upon contact with a semiconductor substrate. Further, if a thermal treatment process is performed as a subsequent process after the tungsten silicide film is buried, contact resistance with a silicon substrate can be reduced, and specific resistance can also be reduced as silicon is recrystallized into a stable phase.

Furthermore, as the source contact is formed of the tungsten silicide film, abnormal oxidization, which is generated in a contact through which a first metal line is exposed due to the remaining oxygen in a subsequent annealing, can be prevented in a subsequent first metal line process. Chemical atmosphere of the tungsten silicide film itself can be stabilized.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a source contact of a flash memory device, comprising the steps of:
    forming a first interlayer insulating film on a semiconductor substrate in which first junction regions and gate electrode patterns for SSL and DSL of a cell region and second junction regions for peripheral circuits of a peripheral region are formed;
    patterning the first interlayer insulating film to form a source contact hole through which the first junction regions for the SSL of the cell region is exposed on one sides of the gate electrode patterns for SSL;
    forming a film on the entire surface including the source contact hole;
    performing a polishing process until the first interlayer insulating film is exposed to form a source contact;
    forming a second interlayer insulating film on the entire surface including the source contact;
    patterning the second interlayer insulating film to expose the second junction regions formed in the peripheral region of the semiconductor substrate;
    performing an ion implant process on the exposed junction regions; and
    performing a thermal treatment process to form third junction regions in the second junction regions of the peripheral region.

2. The method as claimed in claim 1, wherein the film is one of a tungsten silicide film, a tungsten silicide film/polysilicon film, a polysilicon film/tungsten suicide film, and a dual film of a tungsten silicide film.

3. The method as claimed in claim 2, wherein the tungsten silicide film is formed CVD mode using a MS ($SiH_4$) or DSC ($SiH_2Cl_2$)-based $WSi_x$ film at a temperature of about 330 to 450° C. or 550 to 600° C. and pressure of about 0.4 to 3 Torr.

4. The method as claimed in claim 1, wherein the thermal treatment process is preformed at a temperature of about 850 to 1000° C. for about 20 to 40 minutes, or at a temperature of about 900 to 1000° C. for about 10 to 20 seconds.

5. A method as claimed in claim 1, further comprising the steps of:
    forming a anti-diffusion film along the sidewalls of the entire surface including the second junction regions; and
    forming a metal line by depositing a metal material on the entire surface, then performing a polishing process until the anti-diffusion film are exposed.

6. A method of forming a source contact of a flash memory device, comprising the steps of:
    forming gate electrode patterns for cell transistor, SSL and DSL of a cell region and for peripheral circuits of a peripheral region;
    forming first junction regions on the entire surface including the gate electrode patterns;
    forming spacers on a sidewall of the gate electrode patterns;
    forming second junction regions by performing an ion implant process on the entire surface including the spacers;
    forming a first interlayer insulating film on the entire surface;
    forming a source contact hole by patterning the first interlayer insulating film through the first junction region for the SSL is exposed on one sides of the gate electrode pattern for SSL;
    forming a source contact by filling the source contact hole with a film;
    forming a second interlayer insulating film and an etch-stop film sequentially on the entire surface including the source contact;
    forming a drain contact hole by patterning the first interlayer insulating film, the second interlayer insulating film and the etch-stop film through the second junction regions are exposed;
    forming a drain contact by filling the drain contact hole with a metal film;
    forming a third interlayer insulating film on the entire surface including the drain contact;
    forming first via holes to be exposed the drain contact, the source contact and the second junction regions of the peripheral region; and
    forming a third junction region by performing an ion implant process on the second junction regions of the peripheral region.

7. The method as claimed in claim 6, wherein the steps of forming the gate electrode patterns comprising the step of:
    depositing a tunnel oxide film, a first polysilicon film for floating gate electrode, an ONO film, a second polysilicon film for control gate electrode, and a tungsten silicide film sequentially on a semiconductor substrate; and
    performing an etching process using a photoresist pattern as an etch mask.

8. The method as claimed in claim 6, wherein the step of forming the spacers comprises depositing a nitride film on the entire surface in which the gate electrode patterns are formed, then performing an etch-back process on the nitride film.

9. The method as claimed in claim 6, wherein the spacers are formed on both sidewalls of the gate electrode patterns for peripheral circuits, on one sidewall of the gate electrode pattern for DSL, and on one sidewall of the gate electrode pattern for SSL.

10. The method as claimed in claim 9, wherein the nitride film is buried between the cell transistor and the cell transistor, one sidewall of the gate electrode pattern for DSL and the cell transistor, and one sidewall of the gate electrode pattern for SSL and the cell transistor.

11. The method as claimed in claim 6, wherein the film is one of a tungsten silicide film, a tungsten silicide film/polysilicon film, a polysilicon film/tungsten silicide film, and a dual film of a tungsten silicide film.

12. The method as claimed in claim 11, wherein the tungsten silicide film is formed CVD mode using a MS ($SiH_4$) or DSC ($SiH_2Cl_2$)-based $WSi_4$ film at a temperature of about 330 to 450° C. or 550 to 600° C. and pressure of about 0.4 to 3 Torr.

13. The method as claimed in claim 6, further comprising the steps of:
    forming a butting contact hole on the gate electrode pattern for peripheral circuits after forming a second junction regions;
    performing an oxidization process on the entire surface in which the butting contact hole is formed in the gate electrode pattern for peripheral circuits to form a buffer oxide film; and
    forming a nitride film for SAC on the buffer oxide film.

14. A method as claimed in claim 6, further comprising the steps of:
    performing a thermal treatment process on the entire surface including the third junction regions;
    forming an anti-diffusion film along the sidewalls of the entire surface including the third junction regions; and
    forming a metal line by depositing a metal material on the entire surface, then performing a polishing process until the anti-diffusion film are exposed.

* * * * *